(12) United States Patent
Menard et al.

(10) Patent No.: US 7,622,753 B2
(45) Date of Patent: Nov. 24, 2009

(54) IGNITION CIRCUIT

(75) Inventors: Samuel Menard, Tours (FR); Benjamin Cheron, Saint Cyr sur Loire (FR); Arnaud Edet, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/512,914

(22) Filed: Aug. 30, 2006

(65) Prior Publication Data

US 2007/0063305 A1 Mar. 22, 2007

(30) Foreign Application Priority Data

Aug. 31, 2005 (FR) .................................. 05 52616

(51) Int. Cl.
*H01L 27/02* (2006.01)
(52) U.S. Cl. ...................... 257/121; 257/146; 257/107; 257/114; 257/E27.004; 257/601; 310/68 R; 310/70 R; 310/70 A
(58) Field of Classification Search ............... 310/68 R, 310/70 R
See application file for complete search history.

(56) References Cited

U.S. PATENT DOCUMENTS

| | | | |
|---|---|---|---|
| 3,795,846 A | 3/1974 | Ogawa et al. | |
| 4,275,322 A * | 6/1981 | Cavil et al. ................... | 310/111 |
| 5,447,131 A * | 9/1995 | Nickel et al. ................. | 123/335 |
| 5,652,455 A * | 7/1997 | Zambrano .................... | 257/360 |
| 6,075,277 A | 6/2000 | Pezzani | |
| 6,215,289 B1 * | 4/2001 | Simonnet ..................... | 323/282 |
| 6,252,257 B1 | 6/2001 | Duclos et al. | |
| 2002/0020893 A1 | 2/2002 | Lhorte | |
| 2004/0201035 A1 | 10/2004 | Oka | |

FOREIGN PATENT DOCUMENTS

| | | |
|---|---|---|
| DE | 3421185 A1 | 12/1985 |
| FR | 2 062 465 A | 6/1971 |
| WO | WO 92/04540 A1 | 3/1992 |

OTHER PUBLICATIONS

French Search Report from French Patent Application 05/52616, filed Aug. 31, 2005.

* cited by examiner

*Primary Examiner*—Minh-Loan T Tran
*Assistant Examiner*—Fei Fei Yeung Lopez
(74) *Attorney, Agent, or Firm*—Lisa K. Jorgenson; James H. Morris; Wolf, Greenfield & Sacks, P.C.

(57) ABSTRACT

A component formed in a substrate of a first conductivity type, having two inputs and two outputs and: a first diode having its anode connected to a first input and having its cathode connected to a first output; a second diode having its anode connected to a second output and having its cathode connected to the first input; a one-way switch having its anode connected to the first output, its cathode being connected to the second output; and a third diode having its anode connected to the second output, its cathode being connected to the first output; the first, second, and third diodes being formed in a first portion of the substrate separated by a wall of the second conductivity type from a second substrate portion comprising the switch.

9 Claims, 2 Drawing Sheets

IGNITION CIRCUIT

BACKGROUND OF THE INVENTION

1. Field of the Invention

The present invention relates to the field of integrated power supply circuits. More specifically, the present invention relates to the integration of a component belonging to the ignition circuit of a two-stroke motor.

2. Discussion of the Related Art

FIG. 1 is a partial simplified equivalent electric diagram of an ignition circuit for a two-stroke motor.

The circuit comprises, between two input terminals E and REF, an inductive winding L1 periodically excited by the passing of a magnet, not shown, arranged on a wheel which is set to motion with the crankshaft when the motor is desired to be started.

A terminal A is connected to a first positive armature of a capacitor C. A second negative armature of capacitor C is connected to a terminal K via a primary winding N1 of a magnetic circuit having a secondary winding N2 providing a high voltage to a circuit for igniting a two-stroke motor, the structure of which is not described in detail.

Terminals REF and K are interconnected to correspond to a low reference terminal of the circuit.

Between terminal E and terminal A, the circuit comprises a diode D2 only conducting the current from terminal E to terminal A.

A normally-off one-way switch controllable to be turned on is connected between terminal A and terminal K. For example, the normally-off switch is a thyristor Th having its cathode connected to terminal K. Gate G is connected to a control circuit DRIVE capable of providing a turn-on control signal.

A free-wheel diode D3 is connected between terminals A and K in anti-parallel with respect to thyristor Th.

A diode D1 is connected between terminals E and REF, its anode being connected to terminal REF. Cathode F of diode D1 is connected to terminal E via a resistor R.

The operation of the circuit of FIG. 1 is the following.

On passing of the magnet close to winding L1, the magnetic flow variation causes the occurrence of a current pulse. The displacement direction of the magnet and the winding direction of coil L1 is such that the pulse charges capacitor C through diode D2. Diode D1 and resistor R are used to absorb a possible negative current between terminals E and Ref.

Capacitor C and winding L1 are sized so that a single passing of the magnet close to winding L1 causes a sufficient current pulse to charge capacitor C to a required maximum voltage level.

The magnet also passes in front of a winding, not shown, forming the power supply of control circuit DRIVE of thyristor Th. The location and the dimensions of this winding are such that thyristor Th is controlled to be turned on while capacitor C has reached the maximum voltage level.

Then, capacitor C discharges into the circuit formed of capacitor C, primary winding N1, and the conduction path of thyristor Th. This circuit is an oscillating circuit and the negative halfwaves pass through free wheel diode D3. This results in the occurrence of a high voltage across secondary winding N2.

SUMMARY OF THE INVENTION

The present invention aims at providing the forming of the portion of this two-stroke motor ignition circuit comprised between terminals E, A, K, and G in the form of a monolithic semiconductor circuit.

To achieve this object and others, the present invention provides a component formed in a semiconductor substrate of a first conductivity type, comprising two input terminals and two output terminals and comprising:

a first diode having its anode connected to a first input terminal and having its cathode connected to a first output terminal;

a second diode having its anode connected to a second output terminal and having its cathode connected to the first input terminal;

a normally-off one-way switch controllable to be turned on having its anode connected to the first output terminal and having its cathode connected to the second output terminal; and a third diode having its anode connected to the second output terminal and having its cathode connected to the first output terminal;

the first, second, and third diodes being formed in a first portion of the substrate and the switch being formed in a second portion of the substrate separated from the first portion by a wall of the second conductivity type crossing the entire substrate thickness.

According to an embodiment of the present invention, the second diode is formed horizontally and the first and third diodes and the switch are formed vertically.

According to an embodiment of the present invention, the switch is a cathode-gate thyristor.

According to an embodiment of the present invention, the first diode is formed of a junction formed at the front surface between a first heavily-doped surface region of the second conductivity type and the substrate.

According to an embodiment of the present invention, the contact with the substrate is provided by a second heavily-doped surface region of the first conductivity type formed at the rear surface in the entire first portion.

According to an embodiment of the present invention, the component comprises, at the front surface in the first portion, a third heavily-doped surface region of the first conductivity type formed in a fourth lightly-doped surface region of the second conductivity type.

According to an embodiment of the present invention, a resistor is interposed between the cathode of the second diode and the first input terminal.

According to an embodiment of the present invention, the component comprises at the front surface, close to the first region, a fifth heavily-doped region of the second conductivity type, a sixth lightly-doped region of the second conductivity type extending between the first and fifth region.

According to an embodiment of the present invention, the second portion of the substrate comprises at the front surface a seventh heavily-doped region of the first conductivity type formed in an eighth heavily-doped region of the second conductivity type and having its rear surface comprising at least a ninth heavily-doped region of the second conductivity type.

The present invention also provides a circuit for igniting a two-stroke motor, comprising a component according to any of the preceding embodiments.

The foregoing and other objects, features, and advantages of the present invention will be discussed in detail in the following non-limiting description of specific embodiments in connection with the accompanying drawings.

DETAILED DESCRIPTION

Figure 1:
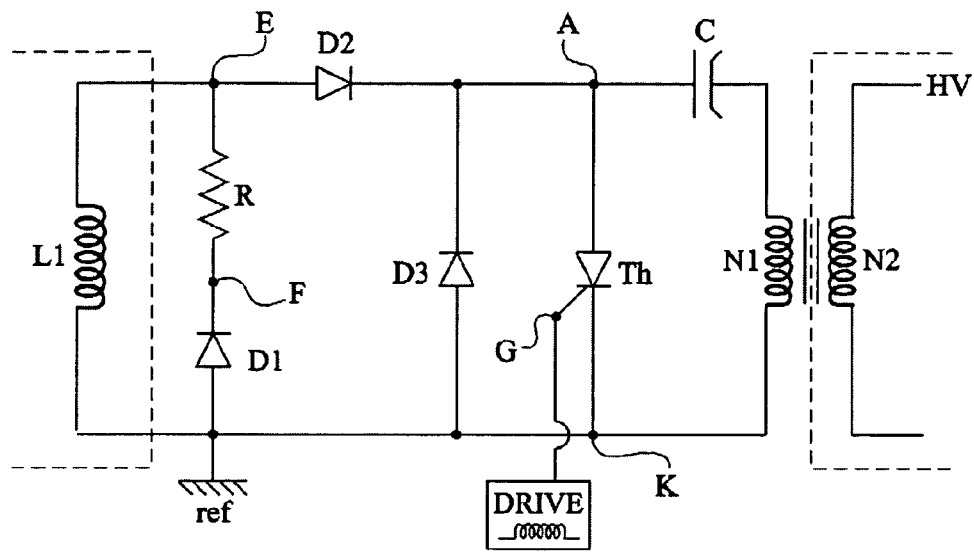
FIG. 1 is a partial simplified equivalent electric diagram of a two-stroke motor ignition circuit.

For clarity, the same elements have been designated with the same reference numerals in the different drawings and, further, as usual in the representation of integrated circuits, the various drawings are not to scale.

Figure 2:
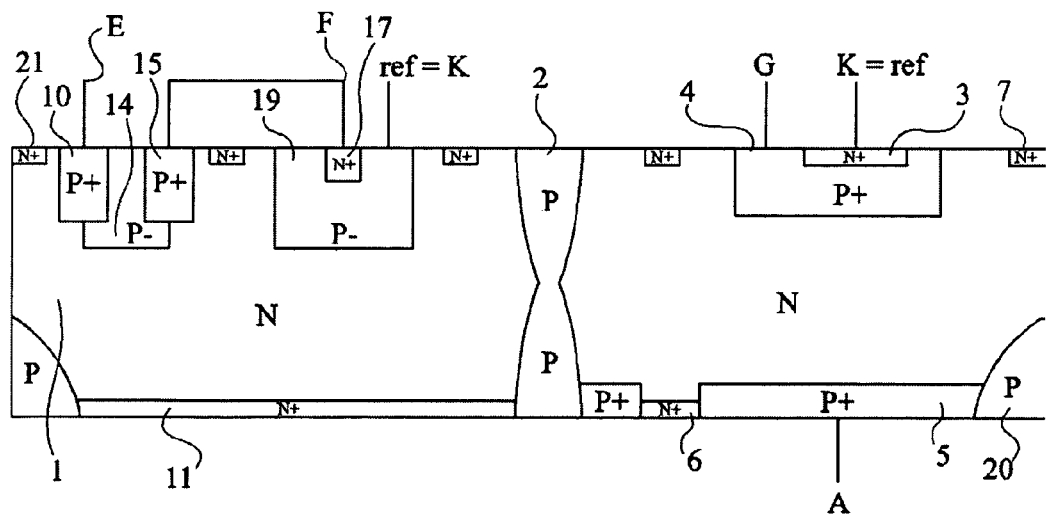
FIG. 2 illustrates, in a partial simplified cross-section view, an embodiment in integrated form according to the present invention of a portion of the circuit of FIG. 1.

FIG. 2 illustrates, in a partial simplified cross-section view, the circuit comprising main terminals E, A, REF-K, and control terminal G of FIG. 1. This circuit integrates resistor R, diodes D1, D2, D3, and thyristor Th. This circuit is formed in a semiconductor substrate, for example, single-crystal silicon. Substrate 1 is medium-doped of a first conductivity type, for example, N.

Substrate 1 is divided in two portions by a P-type doped wall 2 crossing the entire thickness of substrate 1.

A first portion of substrate 1, to the right of FIG. 2, contains normally-off one-way switch Th controllable to be turned on of FIG. 1, for example, a cathode-gate thyristor Th made in vertical form. On the first surface or front surface side of substrate 1, a heavily-doped N-type region 3 intended to form the cathode of thyristor Th is formed. Region 3 is formed in a heavily-doped P-type wall 4. Region 3 is completely formed in a portion of the surface of region 4 and is not in direct contact with substrate 1. Region 3 is solid with a metallization intended to form terminal K or REF of the circuit. Region 4 is solid with a metallization intended to form gate G of thyristor Th.

A heavily-doped P-type region 5 intended to form the anode of thyristor Th is present at the rear surface. Anode region 5 is interrupted by a heavily-doped N-type region 6. Region 6 is formed not to be under region 3 and close to or below region 4. Region 6 is intended to ensure an evacuation of the capacitive charges (dV/dt) accumulating in substrate 1 to avoid turning-on of thyristor Th when it must stand in reverse the raised voltage across capacitor C.

The rear surface is solid with a metallization intended to form terminal A of the circuit.

Preferably, the front surface also comprises a heavily-doped N-type ring-shaped region 7 around region 4 and separate therefrom, intended to form a guard ring to block possible leakage currents.

A second portion of substrate 1, to the left of FIG. 2, comprises all the voltage-controlled one-way switches, for example, diodes D1, D2, and D3, as well as current-limiting resistor R.

Diode D2 is formed vertically between N-type substrate 1 and an anode region (P$^+$) 10 formed at the surface of the front surface of substrate 1. The cathode contact is ensured at the rear surface by a heavily-doped N-type region 11 (N$^+$). Region 10 is solid with a metallization intended to form terminal E of the quadripole. Region 11 is solid with the rear surface metallization forming terminal A of the circuit.

Region 10 is connected, via a lightly-doped P-type well 14 (P$^-$) associated with a heavily-doped P-type region 15 (P$^+$), to a metallization.

A heavily-doped N-type region 17 (N$^+$) is formed in a lightly-doped P-type well 19 (P$^-$). Region 17 is connected by a metallization to region 15. Well 19 is connected by a metallization to terminal REF-K also connected to region 3.

Diode D1 is thus laterally formed between region 17 and region 19. Assembly 15-14-10 forms resistor R placed between terminals E and F of FIG. 1, that is, between cathode region 17 of diode D1 and anode region 10 of diode D2.

Diode D1 may advantageously be formed laterally since the voltage drop across diode D1 is at most supply voltage E-REF. Diode D1 will have a reverse breakdown voltage which will essentially be determined by the doping of region 19, which may be relatively low. However, diode D2 is formed vertically since the voltage thereacross reaches the raised voltage across capacitor C.

Diode D3 is also formed vertically since it must also be able to stand the raised voltage across capacitor C. According to an embodiment of the present invention, diode D3 is advantageously formed by the junction existing between anode region 19 of diode D1 and cathode region 11 of diode D2.

The surface of substrate 1 comprises a guard ring 21 which surrounds the substrate portion comprising regions 10, 14, and 15—that is, diode D2 and resistor R—and the substrate portion comprising regions 17 and 19—that is, diode D1 and diode D3.

It should be noted that diode D3 being formed in a portion of substrate 1 distinct from the portion in which thyristor Th is formed, the compromise between the turn-on sensitivity of thyristor Th and the behavior with respect to capacitive noise dV/dt is easily adjustable.

Wall 2 separating the portion of substrate 1 in which diode D2 is formed from its portion in which thyristor Th is formed, the flow and the accumulation of charges on charge of capacitor C through diode D2 do not risk causing a short-circuit by spurious triggering of thyristor Th.

Figure 3:
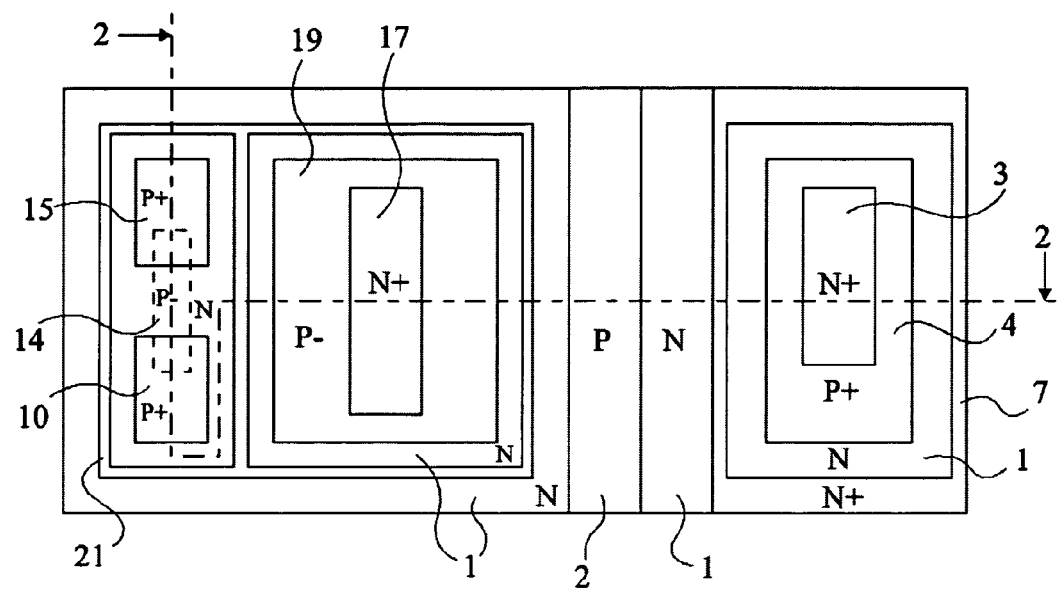
FIG. 3 illustrates, in partial simplified top view, another embodiment in integrated form of the present invention of the same portion of the circuit of FIG. 1.

FIG. 3 illustrates in partial simplified top view an example of topology of the front surface of the component of FIG. 2. Axis 2-2 in dotted lines corresponds to the cross-section axis according to which FIG. 2 is drawn. The component comprises two portions separated by wall 2. Two areas delimited by guard ring 21 are formed in its left-hand portion. A first area comprises regions 10 and 15 and, within well 19, a second area under region 17. In the right-hand portion, ring 7 delimits an area of substrate 1 comprising region 3 formed in region 4.

Figure 4:
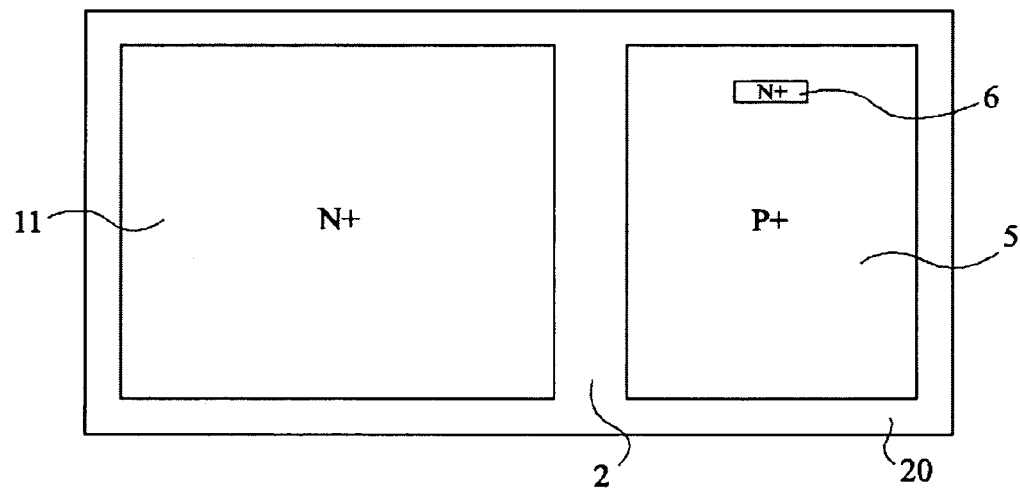
FIG. 4 illustrates, in a partial simplified bottom view, an embodiment in integrated form of the present invention of the same circuit portion of FIG. 1.

FIG. 4 schematically and partially illustrates an embodiment of the rear surface of the component of FIG. 2. The periphery of the rear surface comprises a well 20—already shown in FIG. 2—of the same conductivity type P as wall 2 and intended to protect the component from possible short-circuits linked to solder run-outs. Wall 2 separates the rear surface in two portions. To the right of FIG. 4, wall 2 and well 20 delimit region 11. To the left of FIG. 4, the rear surface comprises region 6 comprised in region 5.

According to an embodiment of the present invention, the doping levels of the different regions of FIG. 2 are the following:

P-type doped regions 14 and 19 from $5.10^{14}$ to $5.10^{15}$ at/cm$^3$, for example, on the order of $10^{15}$ at/cm$^3$;

P-type region 2 from $10^{16}$ to $10^{17}$ at/cm$^3$, for example, on the order of $5.10^{17}$ at/cm$^3$;

P-type doped regions 10, 5, and 4: from $10^{17}$ to $10^{19}$ at/cm$^3$, for example, on the order of $10^{18}$ at/cm$^3$;

N-type doped substrate 1 from $10^{14}$ to $10^{15}$ at/cm$^3$, preferably, on the order of $10^{14}$ at/cm$^3$;

N-type doped region 17 on the order of from $10^{15}$ to $10^{17}$ at/cm$^3$, for example, on the order of $10^{16}$ at/cm$^3$;

N-type doped regions 3, 6, 7, 21 on the order of from $10^{19}$ to $10^{21}$ at/cm$^3$, for example, approximately $10^{20}$ at/cm$^3$.

Of course, the present invention is likely to have various alterations, modifications, and improvements which will readily occur to those skilled in the art. In particular, it should be understood by those skilled in the art that the circuit of FIG. 1 may also use an anode gate turn-off normally-on thyristor. Then, all the conductivity types of FIG. 2 are inverted.

It should be understood by those skilled in the art that only those elements which are necessary to the understanding of the present invention have been previously illustrated and described. Thus, those skilled in the art will understand how to complete the structure of obtain the circuit of FIG. 1. In particular, those skilled in the art will be able to form the different necessary interconnection metallizations. Similarly, the structure of control circuit DRIVE likely to be integrated separately is not detailed herein.

Further, the component according to the present invention has been described in the context of a two-stroke motor ignition circuit. However, such a component is likely to be used in other types of circuits.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A component formed in a semiconductor substrate of a first conductivity type, comprising two input terminals and two output terminals and comprising:
   a first diode having an anode connected to a first input terminal and having a cathode connected to a first output terminal;
   a second diode having an anode connected to a second output terminal and having a cathode connected to the first input terminal;
   a normally-off one-way switch controllable to be turned on having an anode connected to the first output terminal and having a cathode connected to the second output terminal; and
   a third diode having an anode connected to the second output terminal and having a cathode connected to the first output terminal;
   wherein the first, second, and third diodes are formed in a first portion of the substrate and the switch is formed in a second portion of the substrate separated from the first portion by a wall of a second conductivity type crossing the entire substrate thickness and wherein the second diode is formed horizontally and the first and third diodes and the switch are formed vertically.

2. The component of claim 1, wherein the switch is a cathode-gate thyristor.

3. The component of claim 2, wherein the first diode is formed of a junction formed at the front surface between a first heavily-doped surface region of the second conductivity type and the substrate.

4. The component of claim 3, wherein a contact with the substrate is provided by a second heavily-doped surface region of the first conductivity type formed at a rear surface in the entire first portion.

5. The component of claim 3, comprising, at a front surface in the first portion, a third heavily-doped surface region of the first conductivity type formed in a fourth lightly-doped surface region of the second conductivity type.

6. The component of claim 1, wherein a resistor is interposed between the cathode of the second diode and the first input terminal.

7. The component of claim 5, comprising at the front surface, close to the first heavily-doped surface region, a fifth heavily-doped region of the second conductivity type, a sixth lightly-doped region of the second conductivity type extending between the first heavily-doped surface region and the fifth heavily-doped region.

8. The component of claim 7, wherein the second portion of the substrate comprises at the front surface a seventh heavily-doped region of the first conductivity type formed in an eighth heavily-doped region of the second conductivity type and having its rear surface comprising at least a ninth heavily-doped region of the second conductivity type.

9. A circuit for igniting a two-stroke motor, comprising the component of claim 1.

* * * * *

UNITED STATES PATENT AND TRADEMARK OFFICE
CERTIFICATE OF CORRECTION

PATENT NO. : 7,622,753 B2 Page 1 of 1
APPLICATION NO. : 11/512914
DATED : November 24, 2009
INVENTOR(S) : Samuel Menard et al.

It is certified that error appears in the above-identified patent and that said Letters Patent is hereby corrected as shown below:

Claim 3, col. 6, line 18, should read:
formed of a junction formed at a front surface between a Signed and Sealed this Fifth Day of January, 2010

David J. Kappos
*Director of the United States Patent and Trademark Office*